United States Patent
Sickert et al.

(10) Patent No.: US 7,395,972 B2
(45) Date of Patent: Jul. 8, 2008

(54) DATA CARRIER OR DOCUMENT CARRIER

(76) Inventors: Klaus Sickert, Rotdornweg 4, 25474 Bönningstedt (DE); Steffen Drews, Iroldstieg 7, 22559 Hamburg (DE)

( * ) Notice: Subject to any disclaimer, the term of this patent is extended or adjusted under 35 U.S.C. 154(b) by 78 days.

(21) Appl. No.: 10/578,285

(22) PCT Filed: Oct. 27, 2004

(86) PCT No.: PCT/IB2004/052221

§ 371 (c)(1),
(2), (4) Date: May 4, 2006

(87) PCT Pub. No.: WO2005/045754

PCT Pub. Date: May 19, 2005

(65) Prior Publication Data

US 2007/0138297 A1    Jun. 21, 2007

(30) Foreign Application Priority Data

Nov. 6, 2003    (EP) .................................. 03104103

(51) Int. Cl.
*G06K 19/06* (2006.01)
(52) U.S. Cl. ........................................ 235/492; 235/487
(58) Field of Classification Search ................. 235/492, 235/380, 487; 343/873, 803, 841, 867, 868, 343/871
See application file for complete search history.

(56) References Cited

U.S. PATENT DOCUMENTS 5,710,421 A * 1/1998 Kokubu ...................... 235/492

| 2002/0129488 | A1 | 9/2002 | Lieberman |
| 2003/0050009 | A1 | 3/2003 | Kurisko |
| 2005/0236489 | A1 * | 10/2005 | Droz ........................... 235/487 |

FOREIGN PATENT DOCUMENTS

| DE | 197 21 057 | 11/1998 |
| EP | 0292249 | 11/1988 |
| EP | 0 780 007 | 4/1999 |
| EP | 1 258 943 | 11/2002 |
| EP | 1 291 818 | 12/2003 |
| JP | 2000-301861 | 10/2000 |
| JP | 2001092934 A * | 4/2001 |
| JP | 2004005494 A * | 1/2004 |
| WO | WO 96/07985 | 3/1996 |

* cited by examiner

*Primary Examiner*—Daniel St. Cyr

(57) ABSTRACT

An electrical or electronic data/document carrier as well as a method of communication, for the contactless transmission and/or for the contactless exchange of data and/or of energy, between at least one base/central station and at least one electrical or electronic data/document carrier in such a way that data and information cannot be read from the data/document carrier without the agreement, knowledge and/or assistance of the user or owner of the data/document carrier. The data/document carrier can be moved to and from between a first position defined as an unfolded or opened state and a second position defined as a folded or closed state, and the data/document carrier is coupled to the base/central station essentially only in the first position or essentially only in the second position or essentially only in a position between the first position and the second position.

5 Claims, 5 Drawing Sheets

DATA CARRIER OR DOCUMENT CARRIER

The present invention relates to an electrical or electronic data carrier or document carrier that is designed for communication, in particular for the contactless transmission and/or for the contactless exchange of data and/or of energy, with at least one base station or central station, in particular with at least one read/write station, having at least one electrical or electronic circuit as well as at least one coupling element that is conductively connected to the circuit, in particular at least one coupling element for coupling the data carrier or document carrier to the base station or central station.

The present invention furthermore relates to a method for the communication, in particular the contactless transmission and/or contactless exchange of data and/or of energy, between at least one base station or central station, in particular at least one read/write station, and at least one electrical or electronic data carrier or document carrier.

When a contactless data carrier or document carrier of the type mentioned at the outset enters into the correspondingly modulated electromagnetic radio frequency (RF) field of a base station or central station, for example of a suitable read/write station, or is exposed to such an electromagnetic field, as a rule the data carrier or document carder at least allows itself to be identified as such.

Thereupon a transmission of data and/or information between the data carrier or document carrier and the base station or central station can be initiated. In many cases, it is undesirable for the data carrier or document carrier to be recognized, for relevant reasons, for example for reasons of data protection, and/or on account of emotional sensitivities.

Thus even due to a simple response of the data carrier or document carrier it is possible to detect, without the permission, knowledge and/or assistance of the user or owner, that this data carrier or document carrier with a particular identification key is located in the electromagnetic field of the base station or central station.

Of particular sensitivity in this connection are applications that are connected to banking and finance and/or to the handling of personal, private or confidential data that need protection; these include official or sovereign documents such as drivers' licenses, identity (ID) cards or passports.

Thus whereas for example in local public transport systems, the relatively simple deduction of money from the contactless data carrier or document carrier represents a well-accepted means of paying travel fares, because it is so desirable for reasons of user-friendliness, in the case of other applications it is necessary to prevent the possibility of personal data being read without the permission, knowledge and/or assistance of the owner of the data carrier or document carrier; in other words, this means that the reading of personal data and information should require the agreement of the user or owner of the data carrier or document carrier in some form or other.

Due to the existing intention of equipping all travel documents world-wide with a contactless data carrier or document carrier for the storage of administrative and additionally of biometric data, the aspect of automatic response of the data carrier or document carrier without the permission, knowledge and/or assistance of the user or owner becomes particularly relevant to the current situation.

The lack of protection against data and information being read without the permission, knowledge and/or assistance of the user or owner is regarded in particular by data protection officers and by consumer organizations as a big hurdle for the planned introduction of travel documents that are equipped with a contactless data carrier or document carrier.

Solutions that have been proposed to date, with an integrated button or switch, or with a sleeve--as a so-called "Faraday cage" for screening off the electromagnetic high-frequency (HF) field of a reader device--have proved to be not very practical and thus not capable of asserting themselves on the market, for in the latter case for example, the ID or travel pass always has to be taken out of the sleeve before use, which is perceived to be troublesome and awkward.

Now in the prior art, as regards the general area of the control of contactless data carriers or document carriers, taking specific account of folding coils or antennae, attention must be drawn to the publication EP 0 292 249 A2, which deals with a data storage system. In order to overcome security problems that exist in the case of paper documents here, affixed to a document or object is an electronic token, for example of the type of a "Smart Card" with "on-board" processing and storage.

In use, the document or object is arranged so that the electronic token, according to the publication EP 0 292 249 A2, is coupled to an external read/write unit in a contactless manner. By means of the token, security-sensitive information can be accessed or added, and in fact exclusively by persons authorized to do this, who have the correct passwords.

The electronic token according to the publication EP 0 292 249 A2 can also be provided on passes, check books and the like; another possible use lies in providing the electronic token on vehicles, in order in this way to store details concerning the driver's license and taxes, keepers of the vehicle to date, and/or data relating to the owner and the driver of the vehicle.

In the publication EP 0 780 007 A1, a thin, flexible electronic high-frequency identification circuit is disclosed, which has an insulating flexible substrate, an antenna, a circuit chip as well as one or more connection leads. The substrate has a recess in which the chip is arranged, with the chip being covered by an encapsulation that fills the distance between the chip and the substrate in the recess.

From the publication EP 1 258 943 A1, we know of a folding mobile telephone that uses one of the shields as a second antenna.

In addition, with regard to the prior art one can also refer to the publications JP 2000-301861, US 2002/0129488 A1 and US 2003/0050009 A1.

Furthermore, from DE 19721057 we know of a data carrier in the form of a card, with at least two card elements, of which at least one has an electrical connection and which have a coil for the transmission of data and energy, which is executed such that activation of the card is possible only in the closed state.

Starting from the disadvantages and inadequacies outlined above, and acknowledging the prior art outlined here, it is an object of the present invention to further develop a data carrier or document carrier of the type named at the outset, such that the coupling element can be manufactured with as little expenditure as possible.

This object is achieved by a data carrier or document carrier with the features stated in claim 1. Advantageous designs and expedient further features of the present invention are characterized in the respective dependent claims.

The present invention is also based on the principle of an automatic release of access to contactless data carriers or document carriers, or on the principle of automatic access control for contactless data carriers or document carriers, that is, of enabling the data carriers or document carriers according to the present invention to distinguish between intended access and unauthorized access, in that at least one coupling element, designed as a capacitive element, is arranged in an appropriate manner in a document with the contactless data carrier or document carrier, for example in a passport.

Such a capacitive element is easy to manufacture (e.g. by means of electroplating) and can thus be deployed very economically.

In an expedient embodiment of the present invention, one can use the so-called "booklet" structure of typical machine-readable travel documents (MRTDs).

According to a further feature of the present data carrier or document carrier, as well as of the work procedure related to it, a capacitive coupling takes place by means of at least two capacitors. One plate of the capacitor is inserted respectively into the front page of the document and into the back page of the document. The corresponding other plates of the capacitors are a constituent part of the base station or central station.

A further design of the capacitive coupling is achieved where the two capacitive plates of the document extend beyond the connection axis, but mesh with one another. Through this, when the document is open, communication is possible only over very short distances, and even this is possible only when the coupling elements in data carriers or document carriers and the base station or central station have the same structure, and the coupling elements are sufficiently aligned to one another. In the case of greater distances between the data carrier or document carrier and the base station or central station, the electrical fields of the toothed capacitor plates largely compensate themselves, so that data transmission cannot take place. The data are thus protected to a high degree, even in the case of an unintentionally open document.

In order to achieve an additional coding, the toothing can be set specifically for each data carrier or document carrier. Just which toothing is present in the data carrier or document carrier can be stored e.g. in an encrypted manner in the document, and can be read for example with optical methods when the authenticity of the document is checked. The base station or central station can then set the corresponding toothing. Additional coding is thus achieved.

The present invention relates furthermore to a base station or central station, in particular a read/write station, for communication, in particular for contactless transmission and/or contactless exchange of data and/or of energy, with at least one electrical or electronic data carrier or document carrier according to the type described above.

The present invention furthermore relates to an electrical or electronic communication system, having at least one electrical or electronic data carrier or document carrier according to the type described above, as well as at least one base station or central station, in particular a read/write station, according to the type described above.

The present invention finally relates to the use of at least one electrical or electronic data carrier or document carrier according to the type described above and/or of at least one base station or central station, in particular a read/write station, according to the type described above, and/or of at least one electrical or electronic communication system according to the type described above, and/or of a method according to the type described above, in at least one in particular machine-readable document, in particular a travel document (e.g., a MRTD), for example in at least one identity document, such as for example in at least one personal identity card, or in at least one pass document, such as for example in at least one passport, or in at least one visa, such as for example in at least one residence permit.

As already discussed above, there are various options for embodying and further developing the theory of the present invention to advantage. Regarding this, on the one hand we refer to the claims subordinate to claim 1, and on the other hand further designs, features and advantages of the present invention are explained in greater detail below, including on the basis of the example implementation of six examples of embodiments that are illustrated by the FIGS. 1A to 6B.

In the drawings.

The same or similar designs, elements or features are given identical reference numbers in the FIGS. 1A to 6B.

In the six examples of embodiments of the present invention, illustrated by FIGS. 1A to 6B, in each case a data carrier or document carrier 100 with an electrical or electronic circuit 10 (e.g., an integrated circuit (IC)) is shown. The data carrier or document carrier 100 works according to the method according to the present invention, and is designed for communication with a base station or central station, in particular with a read/write station.

Figure 1A:
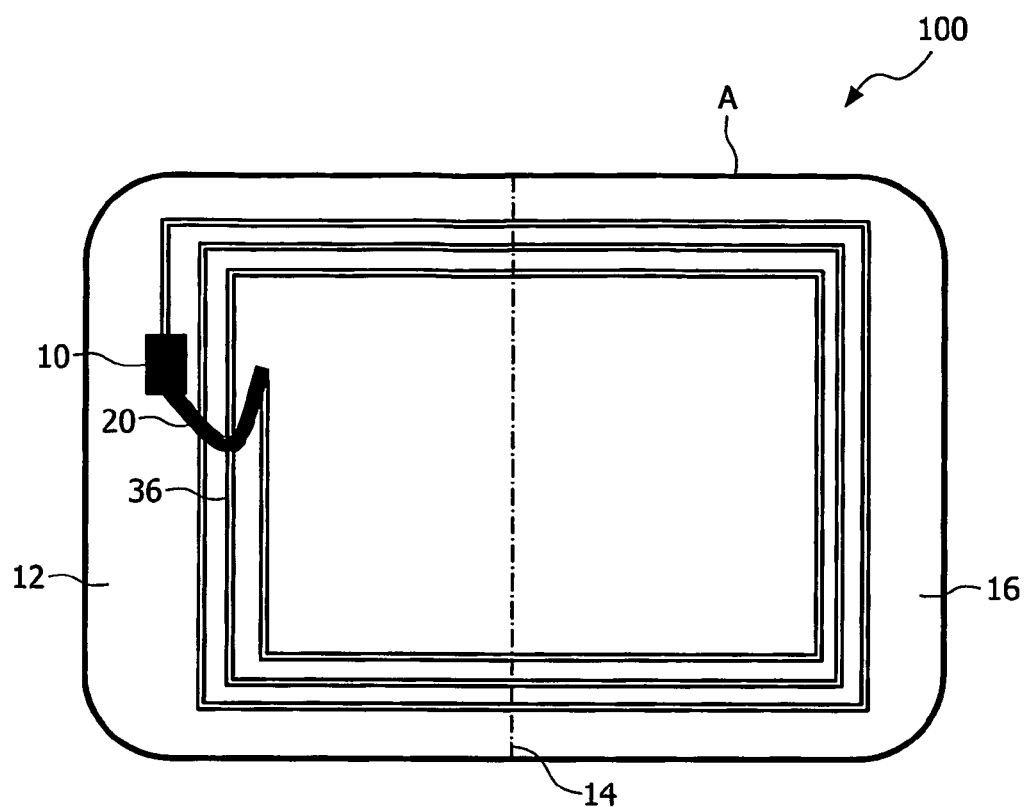
FIG. 1A shows, in schematic aspect, a first example of an embodiment for a data carrier or document carrier according to the present invention, which works according to the method according to the present invention, in the unfolded or opened state.
Figure 1B:
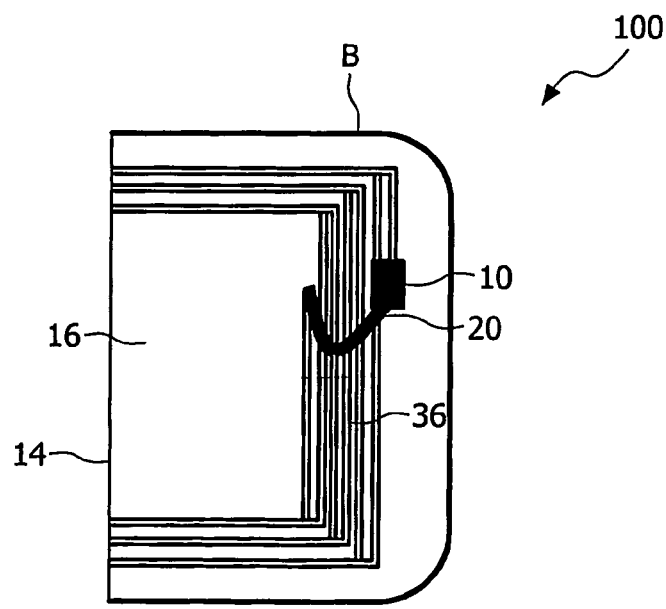
FIG. 1B shows, in schematic aspect, the data carrier or document carrier from FIG. 1A in the folded or closed state.

In the case of the first example of embodiment according to FIGS. 1A and 1B, a coil that symbolically has three turns is integrated as an inductive coupling element 36 of the contactless data carrier or document carrier 100 into a multi-page document, for example into a passport. This coil 36 is conductively connected (20) to the integrated circuit (arrangement) 10, and serves to couple the data carrier or document carrier 100 to the base station or central station.

An important feature of the invention can now be seen in that this inductive element 36 is not, as is conventionally usual, designed either only in the front page 12 (=left-hand half in FIG. 1A) or only in the back page 16 (=right-hand half in FIG. 1A), but as a common coil in the front page 12 and back page 16 (as can be seen from FIG. 1A, running between the front page 12 and the back page 16 is a common connection axis 14, around which the front page 12 and the back page 16 can be folded or tilted against one another).

Through this, according to the invention it is ensured that when the document is in the opened state (=so-called first position A according to FIG. 1A, namely the unfolded or opened state), the electromagnetic HF field is integrally detected, for according to FIG. 1A, when the pass is opened the coil 36 has the full area, so that access by the base station or central station to the data and information is possible.

In the folded state (=so-called second position B according to FIG. 1B, namely the folded or closed state) of the passport, on the other hand, the turns of the coil 36 lie over one another such that the induced voltages compensate themselves and no access from outside, for example by the base station or central station, to the data carrier or document carrier 100 is possible (cf. FIG. 1B: the pass is closed, and access to the data and information is not possible).

Only when the pass is opened for optical or visual reading are the turns of the coil 36 free in such a way that they form an adequate area for coupling with the corresponding read/write station.

Alternatively, instead of the first area or first page 12, in particular of the front area or front page, of the data carrier or document carrier 100, as well as instead of the second area or second page 16, in particular of the back area or back page, of the data carrier or document carrier 100, other suitable pages of the document can also be used in the sense of the present invention.

Figure 2:
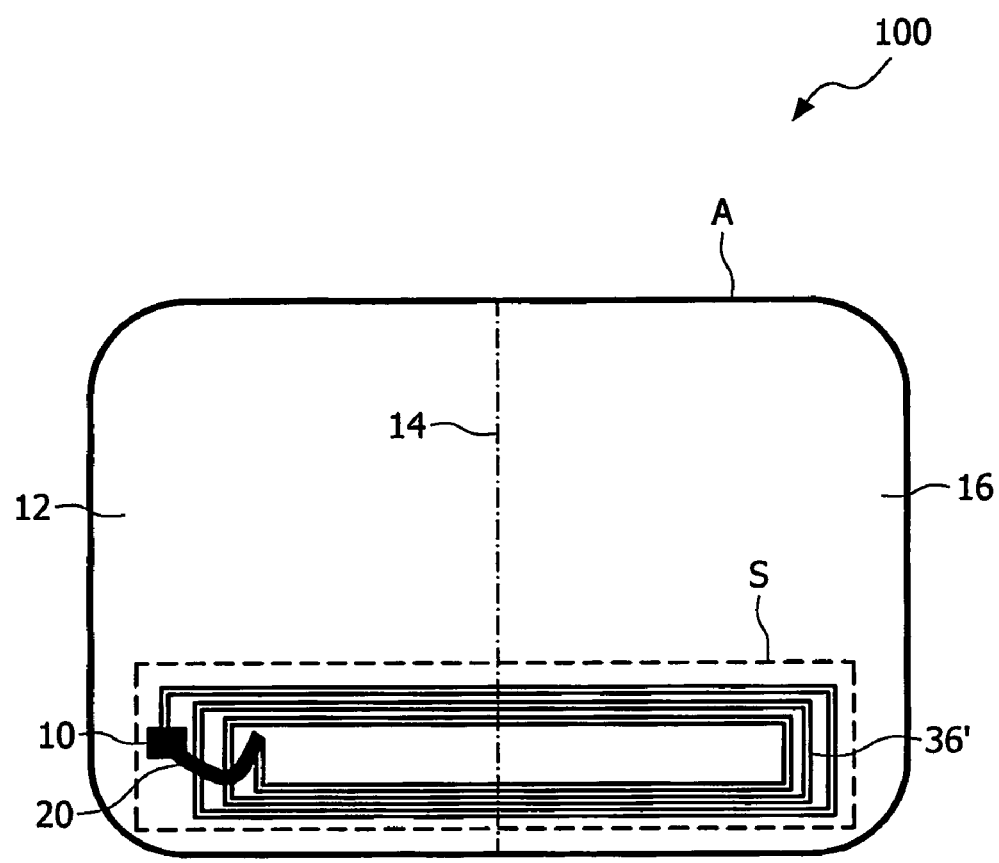
FIG. 2 shows, in schematic aspect, a second example of an embodiment for a data carrier or document carrier according to the present invention, which works according to the method according to the present invention, in the unfolded or opened state.

In the case of a variant of the present invention that is illustrated by FIG. 2, it is also possible to place the coil 36' only as a strip S over the cover 12 as well as the back page 16. This can also yield, amongst other things, cost advantages (cf. FIG. 2: second example of embodiment with small coil 36' as strip S; opened state A). For the rest, with regard to the designs, features and advantages of the second example of embodiment according to FIG. 2, in order to avoid unnecessary repetition we refer explicitly to the explanations given above, relating to the first example of embodiment according to FIGS. 1A and 1B.

Figure 3:
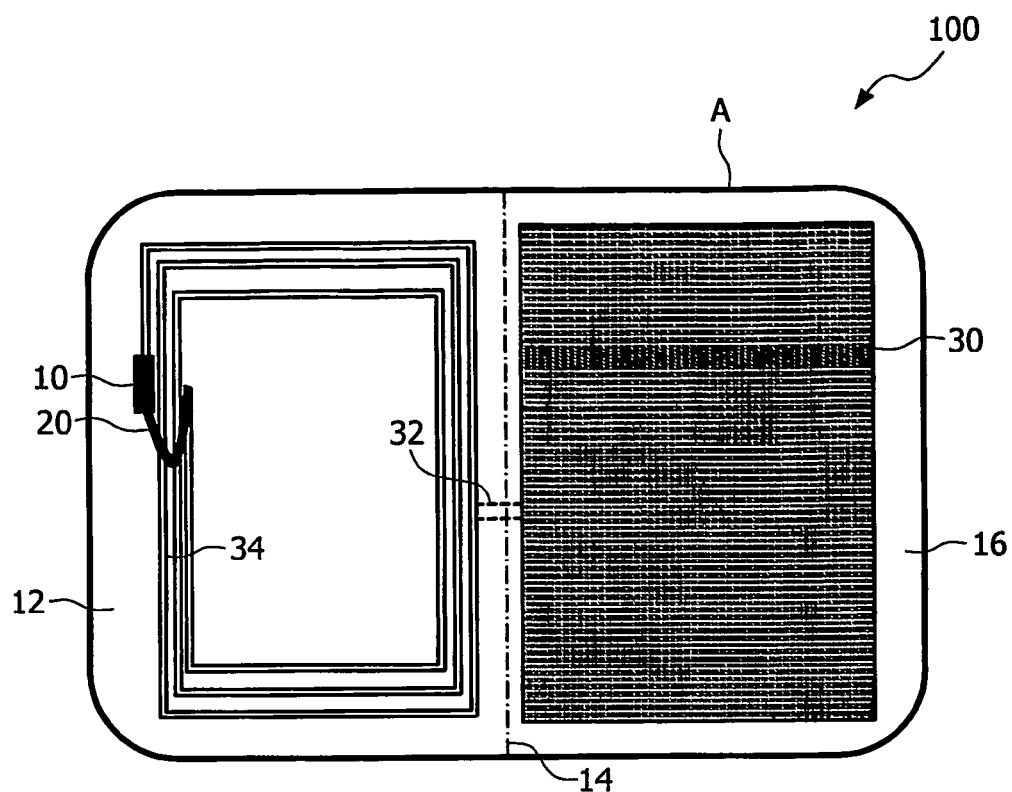
FIG. 3 shows, in schematic aspect, a third example of an embodiment for a data carrier or document carrier according to the present invention, which works according to the method according to the present invention, in the unfolded or opened state.

In a further variant of the present invention that is illustrated by FIG. 3, the coil 34 is not carried on the second page—the right hand page 16 in FIG. 3—of the unfolded document; rather, provided in the second area or on the second page 16, there is instead a metal area in the form of a plate 30, by which the coil 34 is covered over in the closed state B of the data carrier or document carrier 100, so that compensation of the coil 34 by the metal plate 30 takes place.

In order to ensure complete coverage of the coil 34 arranged in the first area or on the first page 12, the metal plate 30 is at least the size of the coil 34, and in the open state A (cf. FIG. 3) of the data carrier or document carrier 100 it assumes a mirrorwise position to the actual coil 34, in relation to the connection axis 14.

Through the eddy current losses that occur in the metal plate 30, the proximity of the metal plate 30 to the inductive coupling element (=coil 34) prevents access by one or more base stations or central stations, for example one or more read/write stations, to the coil 34. In the open state A (cf. FIG. 3), however, this plate 30 remains without effect.

As can be seen from FIG. 3 through the dotted line in the middle, the plate 30 can be connected to the coil 34 in a conductive manner (<->conductive connection 32 between the conductive element 30 and the coupling element 34), or can be inserted fully insulated.

Figure 4:
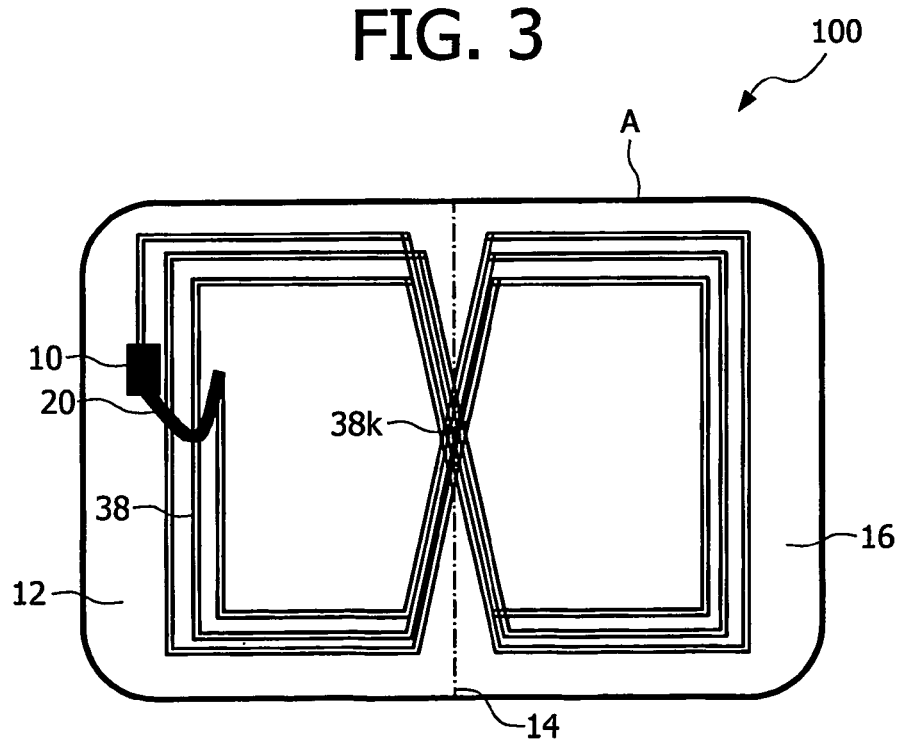
FIG. 4 shows, in schematic aspect, a fourth example of an embodiment for a data carrier or document carrier according to the present invention, which works according to the method according to the present invention, in the unfolded or opened state.

Another execution and design option that can be relevant for flat documents is achieved in the case of a crossed arrangement of the coils 38 in the area of the connection axis 14, i.e. in the middle in FIG. 4. If the turns of the coil 38 are led in the middle over the cross 38k, then data and information can be read only in the closed state B.

In the opened state A on the other hand (cf. FIG. 4), the data carrier and document carrier 100 is barred against reading or contacting by a read/write station, or else reading is possible only with a correspondingly designed read/write station with very narrow coupling (cf. FIG. 4: arrangement with crossed turns as a fourth example of embodiment of the present invention).

Figure 5A:
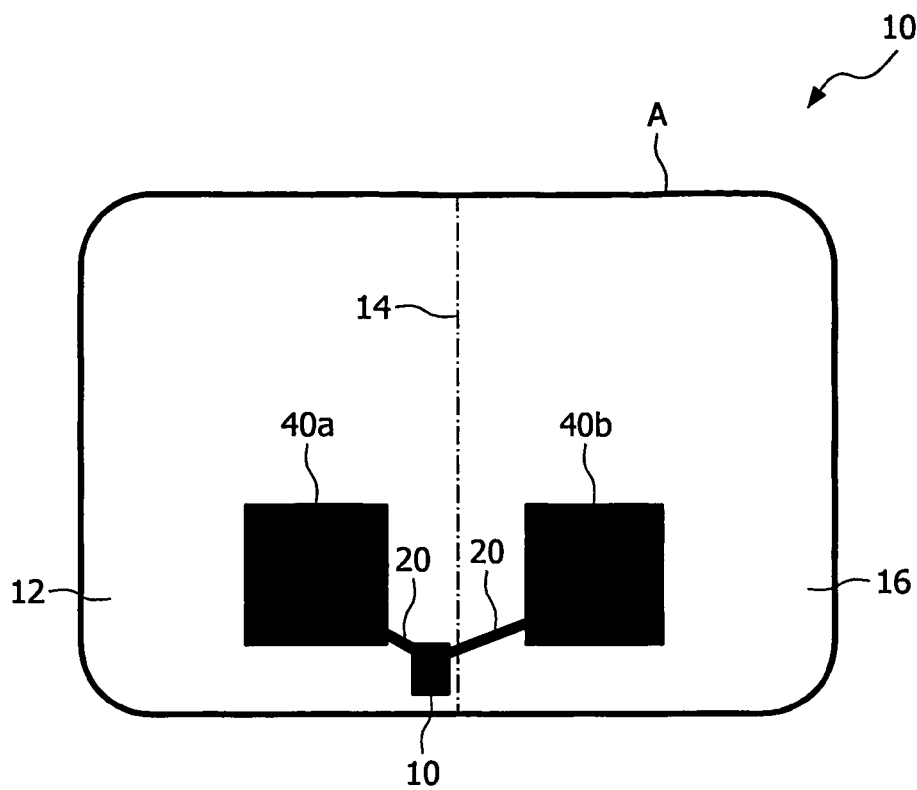
FIG. 5A shows, in schematic aspect, a fifth example of an embodiment for a data carrier or document carrier according to the present invention, which works according to the method according to the present invention, in the unfolded or opened state.
Figure 5B:
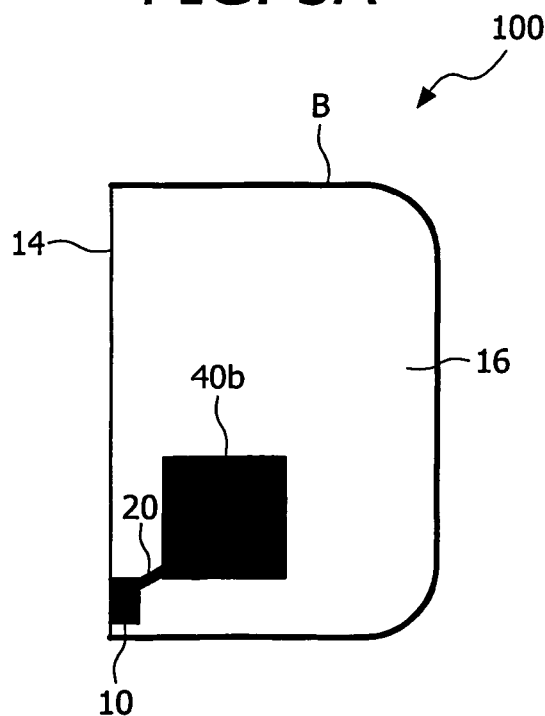
FIG. 5B shows, in schematic aspect, the data carrier or document carrier from FIG. 5A in the folded or closed state.

In the case of the fifth example of embodiment of the present invention, illustrated by FIGS. 5A and 5B, instead of the inductive coupling a capacitive coupling 40a, 40b is employed, wherein capacitively coupled data carriers or document carriers 100 as a rule use two plate pairs instead of coils, namely two plates next to one another in the read/write module (=base station or central station) and two plates 40a, 40b next to one another in the data carrier or document carrier 100.

If the plate pairs of the read/write module and the data carrier or document carrier 100 are brought close to one another, the transmission of energy and data between these plate pairs, as well as the communication between the read/write module and the data carrier or document carrier 100, can take place equivalent to inductive systems.

In the spirit of the present invention, one can now respectively fit a capacitor plate 40a to the front page 12 and a capacitor plate 40b to the back page 16 (or accordingly to the inner pages of the data carrier or document carrier 100) (cf. FIG. 5A: opened pass with capacitive coupling 40a, 40b).

In the case of a closed document (cf. FIG. 5B: closed pass with capacitive coupling 40a, 40b), these plates 40a, 40b then lie above one another such that no transmission of energy and data, and no communication between the read/write module and the data carrier or document carrier 100 can take place, since for this, differential signals would have to be offered and also evaluated by the read/write module.

Figure 6A:
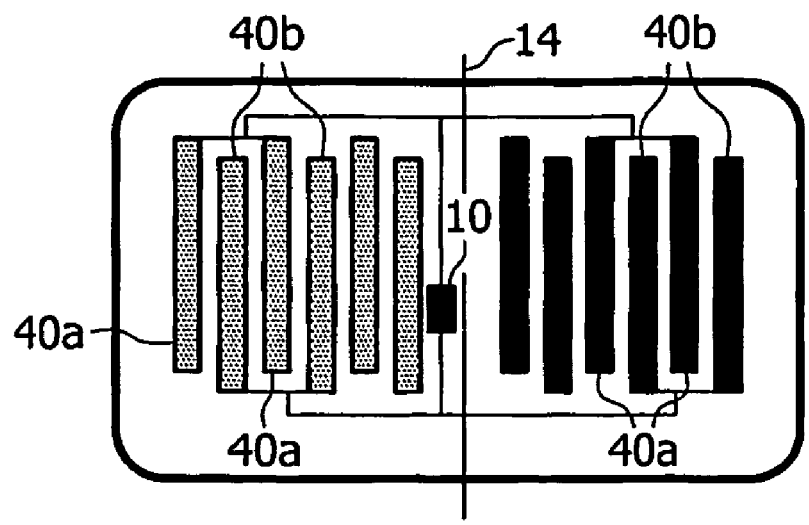
FIG. 6A shows, in schematic aspect, an alternative design of the capacitor plates with coded toothing in the unfolded or opened state.
Figure 6B:
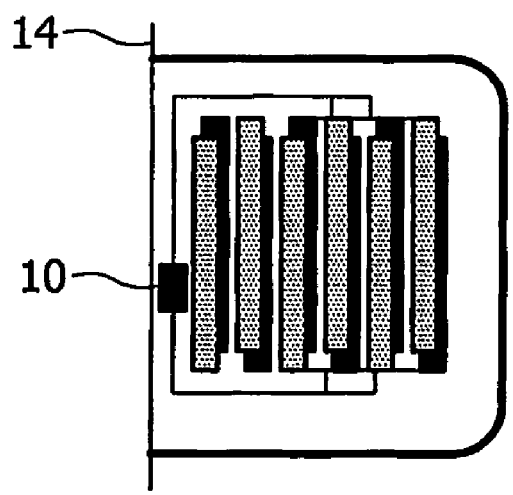
FIG. 6B shows, in schematic aspect, the data carrier or document carrier from FIG. 6A in the folded or closed state.

FIG. 6 represents an alternative execution of the capacitor plates. Here, the capacitive elements 40a and 40 are designed in the form of different elements that are meshed with one another and appropriately connected to one another. These mutually interlocking elements can be of different lengths, which can be used for individual coding.

In closing, it is noted that the term "communication" used above is taken to mean the wireless or contactless exchange of data and/or energy, or the wireless or contactless transmission of data and/or energy.

This means, amongst other things, that through the present invention, an exemplary embodiment is also included, in which the coupling element intended for the data communication, for example a coil intended for the data communication, is accommodated only in the first area or on the first page, for example in the front area or on the front page, of the data carrier or document carrier 100 (this corresponds to an arrangement in accordance with the prior art), whereas the coupling element intended for the energy transmission, for example a coil intended for the energy transmission, is extended over both the first area or over the first page as well as over the second area or over the second page, i.e. for example also over the back area or over the back page, through which the effect described above is achieved in the sense of the present invention.

REFERENCE LIST

100 electrical or electronic data carrier or document carrier
10 electrical or electronic circuit 12 first area or first page, in particular front area or front page, of the data carrier or document carrier 100
14 connection axis between the first area or first page 12 and the second area or second page 16
16 second area or second page, in particular back area or back page, of the data carrier or document carrier 100
20 conductive connection between the electrical or electronic circuit 10 and the coupling element 34, 36, 36', 38, 40a, 40b
30 conductive element, in particular a metal plate
32 conductive connection between the conductive element 30 and the coupling element 34
34 coupling element, in particular an inductive element, for example a coil (third example of embodiment; cf. FIG. 3)
36 coupling element, in particular an inductive element, for example a coil (first example of embodiment; cf. FIGS. 1A and 1B)
36' coupling element, in particular an inductive element, for example a coil (second example of embodiment; cf. FIG. 2)
38 coupling element, in particular an inductive element, for example a coil (fourth example of embodiment; cf. FIG. 4)
38k crossover of the turns of the coupling element 38
40a, 40b coupling element, in particular a capacitive element, for example a capacitor (fifth example of embodiment; cf FIGS. 5A and 5B)
40a first plate of the capacitive element 40a, 40b
40b second plate of the capacitive element 40a, 40b
A first position, namely the unfolded or opened state
B second position, namely the folded or closed state
S strip

The invention claimed is:

1. An electronic data carrier for contactless transmission of data with a base station, the electronic data carrier comprising:
a first page and a second page;
a connection axis between the first page and the second page, wherein the first page and the second page can be folded apart at the connection axis in an opened state and folded toward one another at the connection axis in a closed state;
an electrical circuit to store the data;
a coupling element coupled to the electrical circuit, the coupling element comprising a capacitive element to facilitate the contactless transmission between the electronic data carrier and the base station, wherein the coupling element is at least partially embedded into or integrated with each of the first and second pages, wherein the coupling element is configured to facilitate the contactless transmission with the base station essentially only in one state of the opened state and the closed state;
wherein the capacitive element comprises:
a first plate embedded in the first page; and
a second plate embedded in the second page;
wherein in the opened position the capacitive element assumes a full area on the electronic data carrier to enable access by the base station;
wherein in the closed position the first and second plate of the capacitive element are substantially aligned to disable access by the base station.

2. The electronic data carrier of claim 1, wherein the first plate of the capacitive element comprises individual part-areas connected to one another, and the second plate of the capacitive element comprises additional individual part-areas connected to one another, wherein the individual part-areas of the first and second plate of the capacitive element are arranged to provide toothing that extends beyond the connection axis, wherein an electrical connection between at least some of the individual part-areas of the capacitive element are configured for individual coding.

3. A read/write station for contactless transmission with an electronic data carrier, wherein the electronic data carrier comprises;
a first page and a second page;
a connection axis between the first page and the second page, wherein the first page and the second page can be folded apart at the connection axis in an opened state and folded toward one another at the connection axis in a closed state;
an electrical circuit to store the data;
a coupling element coupled to the electrical circuit, the coupling element comprising a capacitive element to facilitate the contactless transmission between the electronic data carrier and the base station, wherein the coupling element is at least partially embedded into or integrated with each of the first and second pages, wherein the coupling element is configured to facilitate the contactless transmission with the base station essentially only in one state of the opened state and the closed state;
wherein the capacitive element comprises:
a first plate embedded in the first page, the first plate of the capacitive element comprising individual part-areas connected to one another; and
a second plate embedded in the second page, the second plate of the capacitive element comprising additional individual part-areas connected to one another;
wherein in the opened position the capacitive element assumes a full area on the electronic data carrier to enable access by the base station;
wherein in the closed position the first and second plate of the capacitive element are substantially aligned to disable access by the base station;
wherein the individual part-areas of the first and second plate of the capacitive element are arranged to provide toothing that extends beyond the connection axis;
wherein an electrical connection between at least some of the individual part-areas of the capacitive element are configured for individual coding.

4. The read/write station of claim 3, wherein the read/write station as a geometry adapted to the geometry of the individual part-areas of the capacitive element of the electronic data carrier, wherein the read/write station is informed of the coding through information contained in the electronic data carrier to enable the contactless transmission only in an event of identical selection at the electrode connections of the individual part-areas.

5. An electronic communication system comprising: a base station; and
an electronic data carrier for contactless transmission with the base station, wherein the electronic data carrier comprises;
a first page and a second page;
a connection axis between the first page and the second page, wherein the first page and the second page can be folded apart at the connection axis in an opened state and folded toward one another at the connection axis in a closed state;
an electrical circuit to store the data;
a coupling element coupled to the electrical circuit, the coupling element comprising a capacitive element to facilitate the contactless transmission between the electronic data carrier and the base station, wherein the coupling element is at least partially embedded into or integrated with each of the first and second pages, wherein the coupling element is configured to facilitate the contactless transmission with the base station essentially only in one state of the opened state and the closed state;

wherein the capacitive element comprises:
  a first plate embedded in the first page; and
  a second plate embedded in the second page;

wherein in the opened position the capacitive element assumes a full area on the electronic data carrier to enable access by the base station;

wherein in the closed position the first and second plate of the capacitive element are substantially aligned to disable access by the base station.

\* \* \* \* \*